United States Patent [19]

Weldon

[11] 4,118,677
[45] Oct. 3, 1978

[54] PULSE WIDTH MODULATING CIRCUIT

[75] Inventor: James O. Weldon, Dallas, Tex.

[73] Assignee: Continental Electronics Manufacturing Company, Dallas, Tex.

[21] Appl. No.: 529,774

[22] Filed: Dec. 5, 1974

[51] Int. Cl.$^2$ .............................................. H03K 7/08
[52] U.S. Cl. .................................... 332/9 R; 328/223; 331/173
[58] Field of Search ..................... 332/1, 9 R, 9 T, 10, 332/13, 16 R, 16 T, 21, 40, 41; 328/58, 223; 307/265; 331/173, 174

[56] References Cited

U.S. PATENT DOCUMENTS

| | | | |
|---|---|---|---|
| 2,416,368 | 2/1974 | Young, Jr. | 331/173 |
| 2,493,778 | 1/1950 | Rosen | 331/173 |
| 2,498,711 | 2/1950 | Royden | 330/121 |
| 2,611,091 | 9/1952 | Boykin | 331/173 |
| 2,735,014 | 2/1956 | Rado | 331/173 |
| 2,741,701 | 4/1956 | Harris | 331/173 |
| 2,919,414 | 12/1959 | Neitzert | 331/173 |
| 3,200,350 | 8/1965 | Sharp | 328/223 |
| 3,229,227 | 1/1966 | Popodi | 328/223 |

OTHER PUBLICATIONS

Electronics, pp. 63–64, Jan. 25, 1965.

Primary Examiner—John Kominski
Attorney, Agent, or Firm—Nolte & Nolte

[57] ABSTRACT

A modulator includes an output tank circuit energized from a d.c. source through a switching tube and a coupling circuit. The grid of the switching tube is driven by signal-modulated variable width rectangular pulses. The resulting output pulses from the switching tube are used to shock excite the tank circuit and thus produce a carrier wave having an amplitude that varies in accordance with the rectangular pulse width. The trailing edges of the switching tube output pulses are rapidly reduced to zero level by means of an auxiliary circuit that provides spikes of cutoff voltage to the tube grid at the termination of each variable width rectangular pulse. The coupling circuit serves to maintain the anode of the switching tube at a substantially constant voltage level while the tube is conducting so as to provide highly efficient operation.

5 Claims, 2 Drawing Figures

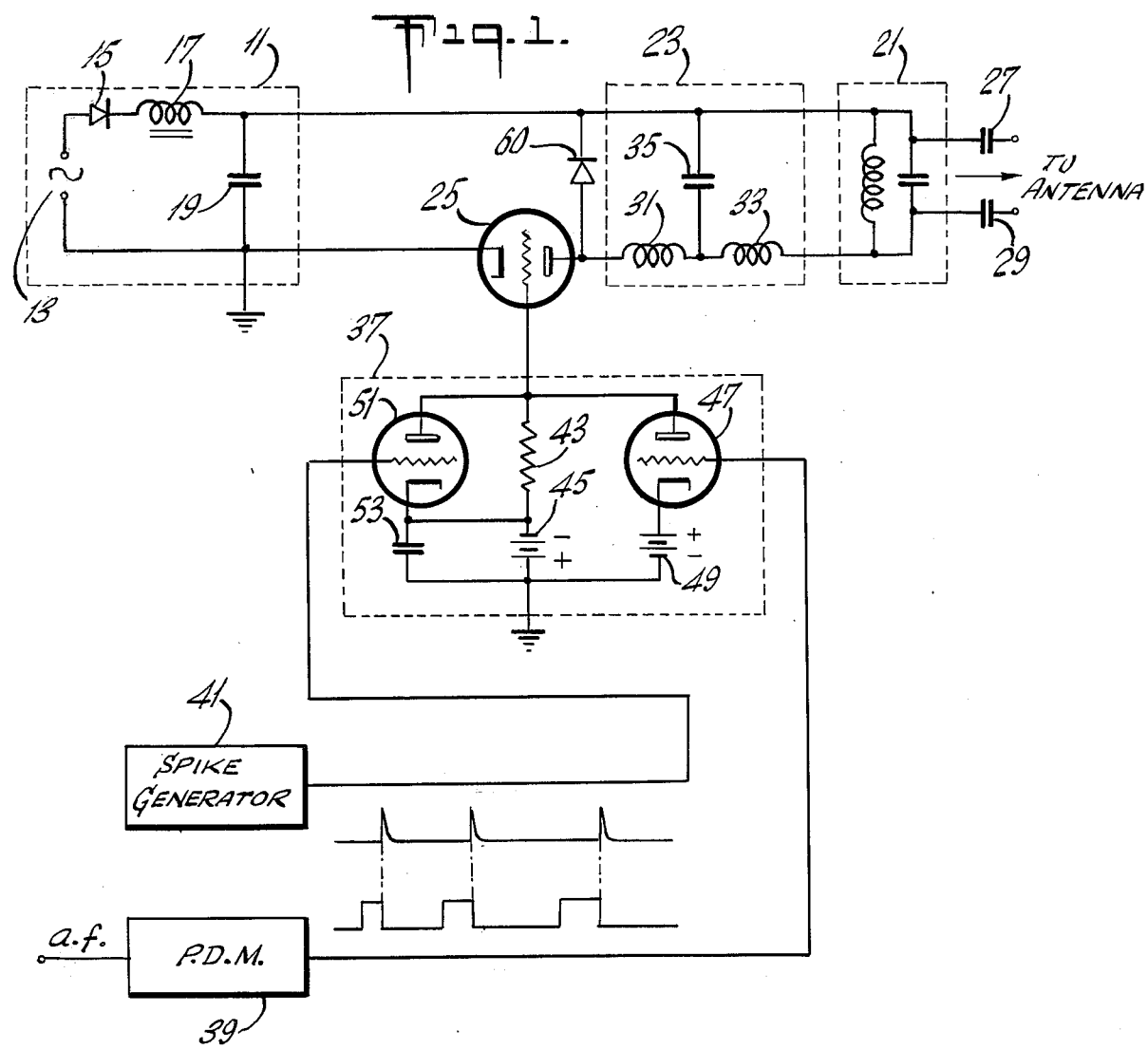
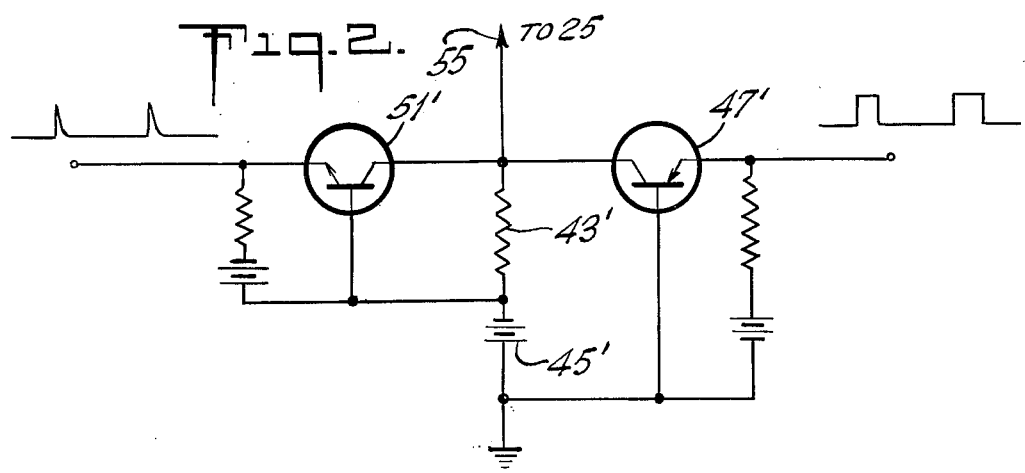

PULSE WIDTH MODULATING CIRCUIT

BACKGROUND OF THE INVENTION

1. Field of the Invention

The invention relates to modulation circuits, and more specifically, to pulse duration modulation circuits.

2. Description of the Prior Art

Pulse duration modulation systems are well known in the prior art. In these systems, an intelligence-bearing signal to be impressed on a carrier wave is converted into a variable duration pulse carrier which, in turn, is used to modulate a high frequency sinusoidal carrier wave.

U.S. Pat. No. 2,445,568, issued to J. C. Ferguson on July 20, 1948 concerns such a pulse duration modulation system. As disclosed by Ferguson, a pulse duration modulated pulse carrier is used to switch a vacuum tube having its anode connected directly to the output tank circuit. Thus, the voltage on the anode varies sinusoidally with the amplitude modulated output signal, even though the "subcarrier" current passes through the tube in substantially rectangular pulses.

Since the power loss in the switching tube is a function of the anode voltage, the tube loss is increased during positive excursions of the anode.

Furthermore, prior art devices such as Ferguson's provide no means for overcoming the effects of interelectrode capacitance in the switching tube so that the trailing edges of the subcarrier current pulses tend to decay slowly.

By overcoming the effects of these two characteristics of the prior art devices, circuits constructed in accordance with the principles of the present invention operate at a higher efficiency and lower operating costs.

SUMMARY OF THE INVENTION

A high efficiency modulating circuit of the type employing a switching device to provide variable width pulses to an output tank circuit employs means to assure that the voltage pulses provided by the switching device are substantially rectangular so as to minimize power losses in the switching device.

BRIEF DESCRIPTION OF THE DRAWINGS

FIG. 1 is a diagram illustrating one embodiment of the invention; and

FIG. 2 is a diagram illustrating a transistorized network useful in driving the switching tube of the invention.

DESCRIPTION OF THE PREFERRED EMBODIMENTS

Referring now to FIG. 1, a d.c. power supply 11 is shown functionally as including an a.c. source 13 coupled through a rectifier 15 and a smoothing choke 17 to a shunt capacitor 19.

Voltage from the power supply is coupled to the output tank circuit 21 through a coupling means 23 and a switching tube 25. The output tank circuit typically contains a parallel resonant circuit which may be coupled to a load such as an antenna through blocking capacitors 27 and 29 or other conventional means.

The coupling circuit 23 is essentially a low-pass filter and has been shown for purposes of illustration as a T-network including input and output series inductors 31 and 33 respectively, and a shunt capacitor 35. The reactive elements in the coupling circuit are selected to provide a cut-off frequency slightly above the operating frequency.

The switching tube 25 in its presently preferred form consists of a vacuum tube having conventional cathode, grid and anode control elements. The cathode of the tube is connected to the grounded side of the power supply 11 and the anode is connected to the input series inductor 31, whereas the grid is connected to receive actuating signals from a pulse squaring circuit 37. The pulse squaring circuit 37 is driven by a pulse duration modulator 39 and a spike generator 41.

The pulse duration modulator 39 is a conventional device which produces an output pulse train wherein the repetition rate is equal to the frequency of the signal to be delivered to the antenna and wherein the individual pulses have durations determined by the instantaneous amplitude of the audio frequency signal applied to the modulator.

The spike generator 41 produces a sharp output spike at the termination of each output pulse from the modulator 39, and may, for instance, comprise a differentiating circuit and pulse inverter responsive to the negative-going trailing edges of the pulses from the modulator.

The output signals from the modulator 39 constitute a pulse carrier signal which acts through the pulse squaring circuit 37 to drive the tube 25 into saturation, whereas the output signals from the spike generator 41 constitute cut-off signals that serve quickly to clamp the grid of the tube 25 to a cut-off bias level at the termination of a pulse from the modulator 39.

The pulse squaring circuit 37 includes a grid resistor 43 connected between the grid of the tube 25 and a source of bias voltage 45 which is sufficient to drive the tube 25 to cut-off. The grid resistor and the bias source are shunted by a driver tube 47 and its anode supply 49. The resistor is shunted by a shorting tube 51 whose cathode is coupled to ground through a capacitor 53.

It will be appreciated that although the voltage sources 11, 45 and 49 are shown as discrete sources, in practice, a single supply having suitable voltage taps would be employed.

The components in the pulse squaring circuit 37 and the operating parameters of the modulator 39 and spike generator 41 are selected so that the tubes 47 and 51 are normally held in a substantially cut-off condition. Under these conditions, the switching vacuum tube 25 is also maintained at cut-off.

The pulses in the pulse carrier train produced by the modulator 39 have a sharp rise time, so that at the inception of such a pulse, the driver tube 47 is quickly driven into conduction. When the driver tube conducts, a positive actuating signal appears on the grid of the switching tube 25, causing this tube to saturate quickly and thus apply a sub-carrier pulse to the resonant circuit of the output tank 21. The energy in the pulse applied to the resonant circuit causes the circuit to oscillate at the frequency to which it is tuned.

Upon the termination of a pulse from the modulator 39, the driver tube quickly returns to cut-off and a voltage spike is applied to the shorting tube 51 from the spike generator 41. The voltage spike causes the shorting tube to conduct heavily, thus shorting out the grid resistor 43 so as to clamp the switching tube 25 immediately to cut-off bias and thereby provide a rapid decay in the current through the switching tube.

In the absence of such a clamping means, charge stored in the interelectrode capacitances of the switching tube during conduction would be slowly dissipated at the termination of an actuating signal, so that the subcarrier pulse applied to the coupling means would have a correspondingly slow decay time. Since the pulse width determines the amplitude of the oscillations produced in the tank circuit, such slow decay times degrade the accuracy and efficiency of the entire system.

The coupling circuit 23 serves to isolate the anode of the switching tube from the oscillatory tank voltages. When the switching tube is driven into saturation, the high frequency components in the subcarrier pulse pass readily through the shunt capacitor 35, thus effectively clamping the anode to the high voltage side of the voltage supply 11. This is opposed to the operation in prior art circuits where the anode is allowed to follow the oscillations in the tank circuit and thus rise to voltage levels in excess of the supply voltage.

The capacitor 35, however, cannot be connected directly between the anode of tube 25 and the supply, since this would necessitate the discharge of the capacitor before the anode voltage of the switching tube 25 could drop to the low voltage required to form a square wave. In order to obtain proper operation with square wave voltages, it is necessary that the input to the coupling circuit 23 be a series inductance.

Since the current to the tube 25 is drawn through a series inductance, i.e. the series inductance 31, the inductive reactance tends to resist cut-off of the current at the end of the pulse. This would result in the voltage at the anode swinging above the d.c. supply voltage. Such over-swinging of the voltage may be prevented by employing a clamp tube or diode 60 connected between the anode of tube 25 and the positive d.c. supply line. The clamp tube clamps the anode to the positive side of the power supply in order that the overswing voltage resulting from the inductive reactance of the series inductor 31 is clamped and hence cannot rise above the positive supply voltage.

The coupling means 23 has been illustrated as a single stage filter network. However, it will be appreciated that multiple stage filters or other known types of low pass filter networks without a capacitor input may be used where desired.

The switching tube 25 has been illustrated as a triode although it is to be understood that other types of vacuum tubes such as tetrodes normally used in high power applications may be preferred in certain applications. Furthermore, other types of electron control devices such as transistors may be used in place of vacuum tubes for providing the switching function.

Similarly, the driver and shorting tubes 47 and 51 may be replaced by suitable transistor elements such as illustrated in FIG. 2 which depicts a pulse squaring circuit that may be substituted for the circuit 37 of FIG. 1. In the circuit of FIG. 2, actuating signals are applied to an appropriate control element in the electron control device 25 through a terminal 55. The terminal 55 is coupled to a bias supply 45' through a resistor 43'. A pnp driver transistor is connected in a common base configuration and biases to a normally cut-off condition. Positive-going pulse carrier signals from the pulse duration modulator drive the transistor into conduction so as to provide the actuating signals to the switching element 25. A npn shorting transistor 51' is biased to a normally cut-off condition but serves to short out the resistor 43' in response to cut-off signals from the spike generator so as to drive the switching element 25 into the cut-off condition as was the case in the corresponding circuit of FIG. 1.

It will be noticed that the improvements provided by the clamping functions of the shorting tube and the coupling network are independent of each other although they cooperate to increase the efficiency of the entire circuit. In some instances, either clamping function may be utilized without the other where a sacrifice in optimum efficiency can be tolerated.

Although the circuit of the invention is primarily intended for the production of amplitude-modulated signals, the principles of the invention may be applied to frequency modulated circuits by using a relatively low Q tank circuit and substituting a conventional pulse time modulating circuit for the pulse duration modulating circuit 39. In such an arrangement, the modulating circuit 39 will produce a train of constant width, variably spaced pulses.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. In a modulating circuit of the type having an electron control device with a control electrode and connected to a constant voltage power supply means by way of a resonant output tank circuit, a source of constant amplitude rectangular pulse signals of pulse repetition rate substantially equal to the output carrier frequency of said tank circuit is connected to actuate said electron control device, and an output circuit is coupled to said tank circuit, whereby modulated subcarrier pulse signals are applied to said tank circuit without a separate radio frequency source, the improvement comprising means for clamping said control device to specified voltage levels during the occurrence of selected portions of said subcarrier pulse signals, wherein said modulated subcarrier pulse signals and said modulated rectangular pulse signals being pulse duration modulated signals and wherein the electron control device is a vacuum tube having a cathode, grid and anode electrically responsive control means, said cathode being connected to a first side of said power supply, said modulating circuit being further characterized in that said clamping means includes a low pass filter connected so as to couple said output tank circuit to the anode of said vacuum tube and to a second side of said power supply, said filter having an input series inductor with one end connected directly to said anode and a shunt capacitor connected between the other end of said series inductor and said second side of the power supply whereby high frequency components of said subcarrier pulses pass through said shunt capacitor to clamp the anode to the voltage level of said second side of the power supply, said grid being actuated from said source of modulated rectangular pulse signals, and wherein said clamping means further includes means to force said grid to a cut-off bias level at the termination of each of said modulated rectangular pulses and said modulating circuit further comprising a source of grid bias voltage having a magnitude sufficient to drive said vacuum tube to cut-off, said modulating circuit further being characterized in that said means to force the grid to a cut-off bias level includes means for generating a voltage spike in response to the trailing edge of each modulated rectangular pulse and means responsive to each voltage spike for momentarily coupling the grid through a relatively low resistance to said source of grid bias voltage.

2. In a modulating circuit of the type having an electronic control device with a control electrode and connected to a constant voltage power supply means by way of a resonant output tank circuit, a source of constant amplitude rectangular pulse signals of pulse repetition rate substantially equal to the output carrier frequency of said tank circuit is connected to actuate said electron control device, and an output circuit is coupled to said tank circuit, whereby modulated sub-carrier pulse signals are applied to said tank circuit without a separate radio frequency source, the improvement comprising means for clamping said control device to specified voltage levels during the occurrence of selected portions of said sub-carrier pulse signals, said modulated sub-carrier pulse signals and modulated rectangular pulse signals being pulse duration modulated signals, said electron control device comprising a vacuum tube having a cathode, grid and anode, said cathode being connected to a first side of said power supply, said modulating circuit being further characterized in that said clamping means includes a low pass filter connected so as to couple said output tank circuit to the anode of said vacuum tube and to a second side of said power supply, said filter having an input series inductor with one end connected directly to said anode and a shunt capacitor connected between the other end of said series inductor and said second side of the power supply whereby high frequency components of said sub-carrier pulses pass through said shunt capacitor to clamp the anode to the voltage level of said second side of said power supply, said grid being actuated from said source of modulated rectangular pulse signals, said clamping means further including means to force said grid to a cut-off bias level at the termination of each of said modulated rectangular pulses, and further including a source of grid bias voltage having a magnitude sufficient to drive said vacuum tube to cut-off, said modulating circuit further being characterized in that said means to force said grid to a cut-off bias level including means for generating a voltage spike in response to the trailing edge of each modulating rectangular pulse and means responsive to each voltage spike for momentarily coupling the grid through a relatively low resistance through said source of grid bias voltage, said grid being permanently coupled to said source of grid bias voltage through a relatively high-valued grid resistor and wherein the combination of said grid bias source and said grid resistor is shunted by a driver tube energized from a source of anode voltage, said driver tube being connected to conduct in response to said modulated rectangular pulse signals, said source of anode voltage having a magnitude and polarity suitable for driving said vacuum tube to saturation.

3. The modulating circuit of claim 2 wherein said means for momentarily coupling the grid to the source of grid bias voltage includes a shorting tube connected across said grid resistor, said shorting tube being connected to remain normally in the cut-off condition and further being connected to be driven into saturation by said voltage spikes.

4. In a modulating circuit of the type having an electron control device with a control electrode and connected to a constant voltage power supply means by way of a resonant output tank circuit, a source of constant amplitude rectangular pulse signals of pulse repetition rate substantially equal to the output carrier frequency of said tank circuit is connected to actuate said electron control device, and an output circuit is coupled to said tank circuit, whereby modulated sub-carrier pulse signals are applied to said tank circuit without a separate radio frequency source, the improvement comprising means for clamping said control device to specified voltage levels during the occurrence of selected portions of said sub-carrier pulse signals, said modulated sub-carrier pulse signals and modulated rectangular pulse signals being pulse duration modulated signals, said electron control device being a vacuum tube having a cathode, grid and anode, said cathode being connected to a first side of said power supply, said modulating circuit being further characterized in that said clamping means includes a low pass filter connected so as to couple said upward tank circuit to the anode of said vacuum tube and to a second side of said power supply, said filter having an input series inductor with one end connected directly to said anode and a shunt capacitor connected between the other end of said series inductor and said second side of said power supply whereby high frequency components of said sub-carrier pulses pass through said shunt capacitor to clamp said anode to the voltage level of said second side of said power supply, said grid being actuated from said source of modulated rectangular pulse signals, said clamping means further including means to force said grid to a cut-off bias level at the termination of each of said modulated rectangular pulses, further including a source of grid bias voltage having a magnitude sufficient to drive said vacuum tube to cut-off, said modulating circuit further being characterized in that said means to force said grid to a cut-off bias level includes means for generating a voltage spike in response to the trailing edge of each modulated rectangular pulse and means responsive to each voltage spike for momentarily coupling said grid through a relatively low resistance to said source of grid bias voltage, said grid being permanently coupled to said source of grid bias voltage through a relatively high-valued grid resistor and wherein the combination of said grid bias source and said grid resistor is shunted by driver transistor means, said driver transistor means being actuated from said source of modulated rectangular pulse signals and arranged to drive said vacuum tube into saturation during the occurrence of a modulated rectangular pulse.

5. The modulating circuit of claim 4 wherein said grid resistor is shunted by shorting transistor means, said shorting transistor means being actuated from said source of voltage spikes and being arranged to remain normally in a cut-off condition, but to be driven into saturation by said voltage spikes.

* * * * *